(12) United States Patent
Kawashima

(10) Patent No.: US 11,316,504 B2
(45) Date of Patent: Apr. 26, 2022

(54) APPARATUS COMPRISING A DIFFERENTIAL AMPLIFIER

(71) Applicant: FUJI ELECTRIC CO., LTD., Kanagawa (JP)

(72) Inventor: Tetsuya Kawashima, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 43 days.

(21) Appl. No.: 16/455,775

(22) Filed: Jun. 28, 2019

(65) Prior Publication Data

US 2020/0044637 A1 Feb. 6, 2020

(30) Foreign Application Priority Data

Aug. 2, 2018 (JP) .............................. JP2018-145511

(51) Int. Cl.
*H03K 5/08* (2006.01)
*H03F 3/45* (2006.01)

(52) U.S. Cl.
CPC ........... *H03K 5/08* (2013.01); *H03F 3/45179* (2013.01); *H03F 2200/129* (2013.01); *H03F 2203/45116* (2013.01)

(58) Field of Classification Search
CPC ......... H03K 5/08; G05F 3/24; H03F 3/45179; H03F 2200/129; H03F 2203/45116
See application file for complete search history.

(56) References Cited

U.S. PATENT DOCUMENTS

| 4,893,090 A * | 1/1990 | Boudewijns ........ H03F 3/45188 330/253 |
| 5,103,166 A * | 4/1992 | Jeon ...................... G06F 11/006 324/750.15 |
| 5,124,632 A * | 6/1992 | Greaves .................... G05F 3/24 323/314 |
| 5,134,309 A * | 7/1992 | Matsumoto .............. H03K 5/02 327/100 |
| 6,294,941 B1 * | 9/2001 | Yokosawa ............... G05F 1/575 327/309 |
| 7,132,887 B1 * | 11/2006 | Aude .................. H03F 3/45183 330/253 |
| 10,020,804 B2 | 7/2018 | Nakagomi |
| 2008/0290942 A1 | 11/2008 | Shimizu |

FOREIGN PATENT DOCUMENTS

| JP | 2001308695 A | 11/2001 |
| JP | 2008288900 A | 11/2008 |
| JP | 2018056750 A | 4/2018 |

* cited by examiner

*Primary Examiner* — Menatoallah Youssef
*Assistant Examiner* — Colleen J O Toole

(57) ABSTRACT

To make it possible to use a transistor with relatively low gate withstand voltage at an output stage in an apparatus including a differential amplifier. An apparatus is provided. The apparatus includes: a differential amplifier having a first current path and a second current path that form a differential pair; a first output-stage transistor that has: a first main terminal connected on a power-supply potential side; a second main terminal connected on a reference-potential side; and a control terminal connected to the second current path; and a first voltage-clamp circuit connected between the control terminal and second main terminal of the first output-stage transistor.

17 Claims, 4 Drawing Sheets

APPARATUS COMPRISING A DIFFERENTIAL AMPLIFIER

The contents of the following Japanese patent application(s) are incorporated herein by reference:
No. 2018-145511 filed in JP on Aug. 2, 2018

BACKGROUND

1. Technical Field

The present invention relates to an apparatus including a differential amplifier.

2. Related Art

There are conventional known buffer circuits that amplify input signals, and output amplified signals (see Patent Literatures 1 to 3, for example). Patent Literatures 1 and 2 describe buffer circuits that output output voltages corresponding to differential input. Patent Literature 3 describes a buffer circuit that is formed by configuring two current mirror circuits in a complementary circuit, and obtains an output signal.

Patent Literature 1: Japanese Patent Application Publication No. 2018-056750
Patent Literature 2: Japanese Patent Application Publication No. 2008-288900
Patent Literature 3: Japanese Patent Application Publication No. 2001-308695

One form of buffer circuits or the like having differential amplifiers obtains output signals by driving transistors at the output stages by using output from the differential amplifiers. Here, in a buffer circuit or the like operated by using a high power-supply voltage (e.g., 30 V), a transistor at the output stage might receive a high voltage from a differential amplifier, so a transistor with high gate withstand voltage is required inevitably.

SUMMARY

In order to solve the drawbacks mentioned above, a first aspect of the present invention provides an apparatus including: a differential amplifier having a first current path and a second current path that form a differential pair; a first output-stage transistor that has: a first main terminal connected on a power-supply potential side; a second main terminal connected on a reference-potential side; and a control terminal connected to the second current path; and a first voltage-clamp circuit connected between the control terminal and second main terminal of the first output-stage transistor.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
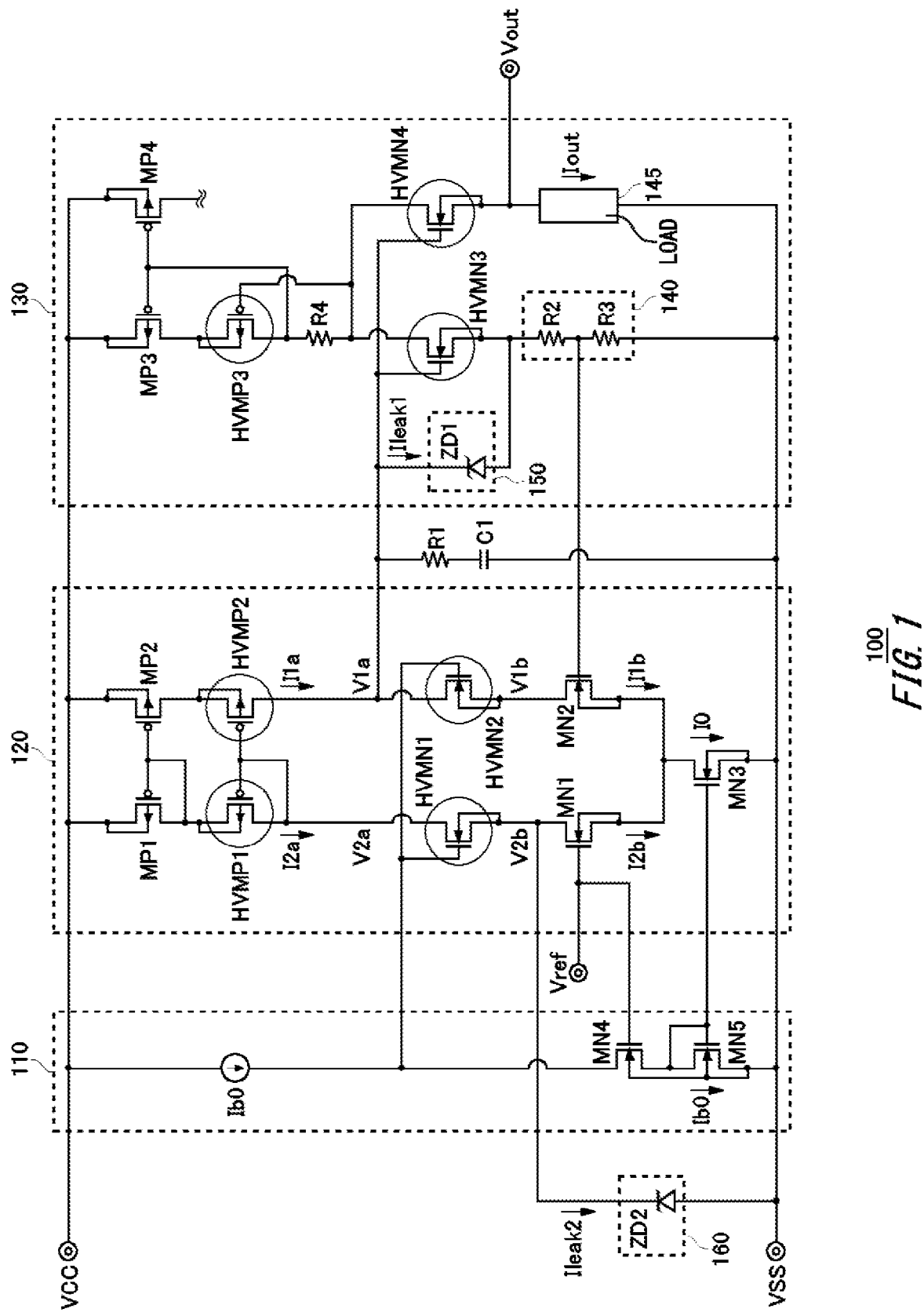
FIG. 1 illustrates the configuration of an apparatus 100 according to an embodiment of the present invention.

FIG. 1 illustrates the configuration of an apparatus 100 according to the present embodiment. The apparatus 100 according to the present embodiment is configured to obtain an output signal by driving a transistor (an NMOS transistor HVMN3 in the figure) in an output circuit 130 by using output from a differential amplifier 120. With the differential amplifier 120 having the configuration illustrated in FIG. 1, the apparatus 100 can lower the gate withstand voltage required of the transistor driven by using output from the differential amplifier 120. Here, in order to prevent breakdown of the control terminal of the transistor when a voltage exceeding the gate withstand voltage of the transistor is output due to abnormal operation or the like, the apparatus 100 is configured to include a first voltage-clamp circuit 150 provided between the control terminal of the transistor and its main terminal on the reference-potential side. In addition, providing the first voltage-clamp circuit 150 in the apparatus 100 might lead to loss of balance between currents to flow through a transistor pair (NMOS transistors MN1 and 2 in the figure) that receives a differential input signal in the differential amplifier 120. In order to suppress such loss of balance, the apparatus 100 may be configured to include a second voltage-clamp circuit 160 connected in a current path which is in the differential amplifier 120, and is opposite to a current path in which the first voltage-clamp circuit 150 is connected.

The apparatus 100 is supplied with a power-supply potential VCC and a reference potential VSS, and outputs an output voltage Vout corresponding to an input reference voltage Vref. Here, the reference potential VSS may be ground potential (0 V) of the apparatus 100, and the power-supply potential VCC is a potential higher than the reference potential VSS (e.g., 30V). The apparatus 100 according to the present embodiment for example functions as a voltage regulator that receives the reference voltage Vref which is a predetermined constant voltage, and outputs an output voltage Vout which is a constant voltage corresponding to the reference voltage.

The apparatus 100 includes a bias-voltage generating circuit 110, the differential amplifier 120, and the output circuit 130. The bias-voltage generating circuit 110 is connected between the power-supply potential VCC and the reference potential VSS. In the specification of the present application, unless stated specifically, "connections" mean "electrical connections", and are not limited to ones that are established by components being electrically connected directly. They may be indirect electrical connections between components that are established with other components being connected therebetween.

The bias-voltage generating circuit 110 generates a reference current Ib0 that determines a tail current I0 to flow through the differential amplifier 120. In addition, the bias-voltage generating circuit 110 generates a bias voltage to be supplied to the differential amplifier 120.

The bias-voltage generating circuit 110 has a current source Ib0, an NMOS transistor MN4, and an NMOS transistor MN5 that are connected in series in this order from the power-supply potential VCC side. Although, in the configuration illustrated in this figure, the power-supply potential VCC, current source Ib0, NMOS transistor MN4, NMOS transistor MN5, and reference potential VSS are directly connected in series, the bias-voltage generating circuit 110 may instead be configured to include an additional constituting element provided between at least one pair of these constituting elements.

The current source Ib0 generates the reference current Ib0, and feeds the reference current Ib0 to the NMOS transistor MN4 and NMOS transistor MN5. The NMOS transistor MN4 has: a first main terminal (drain) connected to the current source Ib0; a second main terminal (source) connected to the NMOS transistor MN5; and a control terminal (gate) connected to the input terminal (Vref) of the apparatus 100. The NMOS transistor MN4 generates, on the first-main-terminal side, a voltage obtained by adding an offset to the reference voltage Vref received at the input terminal, and supplies the voltage to the differential amplifier 120. The NMOS transistor MN5 has: a first main terminal connected to the NMOS transistor MN4; a second main terminal connected to the reference potential VSS; and a control terminal connected to the first main terminal. The NMOS transistor MN5 constitutes a current mirror circuit along with an NMOS transistor MN3 in the differential amplifier 120, adjusts a voltage at the control terminal to a voltage that allows flow of the reference current Ib0, and supplies the voltage to the NMOS transistor MN3.

The differential amplifier 120 is connected between the power-supply potential VCC and the reference potential VSS. The differential amplifier 120 has: an NMOS transistor MN3; a first current path in which the NMOS transistor MN1, an NMOS transistor HVMN1, a PMOS transistor HVMP1, and a PMOS transistor MP1 are connected in series in this order from the NMOS transistor MN3 side; and a second current path in which the NMOS transistor MN2, an NMOS transistor HVMN2, a PMOS transistor HVMP2, and a PMOS transistor MP2 are connected in series in this order from the NMOS transistor MN3 side. The first current path and second current path form a differential pair.

The NMOS transistor MN3 has: a first main terminal (drain) connected to the NMOS transistor MN1 and NMOS transistor MN2; a second main terminal (source) connected to the reference potential VSS; and a control terminal (gate) connected to the control terminal of the NMOS transistor MN5 in the bias-voltage generating circuit 110. The NMOS transistor MN3 causes the tail current I0 to flow, the tail current I0 being obtained by multiplying the reference current Ib0 flowing through the NMOS transistor MN5 by a constant.

The NMOS transistor MN1 is an exemplary first differential-input transistor. The NMOS transistor MN1 has: a first main terminal (drain) that is provided on the power-supply potential side in the first current path, and is connected to the NMOS transistor HVMN1; a second main terminal that is provided on the reference-potential side in the first current path (source), and is connected to the NMOS transistor MN3; and a control terminal that receives the reference voltage Vref as first differential input. The NMOS transistor MN2 is an exemplary second differential-input transistor that forms a pair with the NMOS transistor MN1. The NMOS transistor MN2 has: a first main terminal that is provided on the power-supply potential side in the second current path, and is connected to the NMOS transistor HVMN2; a second main terminal that is provided on the reference-potential side in the second current path, and is connected to the NMOS transistor MN3; and a control terminal that receives second differential input. In the present embodiment, the NMOS transistor MN2 receives, as the second differential input and at the control terminal, a voltage corresponding to a voltage on the second-main-terminal side (source) of the NMOS transistor HVMN3 in the output circuit 130. The NMOS transistor MN1 and NMOS transistor MN2 cause currents I2b and I1b to flow, respectively, the currents I2b and I1b being corresponding to the difference between the first differential input and second differential input. More specifically, if the reference voltage Vref as the first differential input is higher than a comparison target voltage received from the output circuit 130 as the second differential input, the NMOS transistor MN1 and NMOS transistor MN2 make the current I2b larger than the current I1b, and if the reference voltage Vref is lower than the comparison target voltage, the NMOS transistor MN1 and NMOS transistor MN2 make the current I2b smaller than the current I1b. The total of the current I2b and current I1b equals the tail current I0.

The NMOS transistor HVMN1 is an exemplary first bias transistor. The NMOS transistor HVMN1 has a main-terminal interconnecting portion (between the drain and the source) on the power-supply potential side of the NMOS transistor MN1 in the first current path, and receives, at the control terminal (gate), a bias voltage from the bias-voltage generating circuit 110. The NMOS transistor HVMN1 is turned on if the bias voltage received at the control terminal is higher than a voltage at the second main terminal by an amount corresponding to or larger than a threshold voltage of the NMOS transistor HVMN1. Here, as a bias voltage to be received at the control terminal of the NMOS transistor HVMN1, the bias-voltage generating circuit 110 generates a voltage that turns on the NMOS transistor HVMN1, but does not cause breakdown of the control terminal even if the NMOS transistor HVMN1 has low gate withstand voltage. Thereby, the NMOS transistor HVMN1 restricts the voltage at the second main terminal to a voltage obtained by subtracting the gate-source voltage of the NMOS transistor HVMN1 from the bias voltage. The NMOS transistor HVMN2 is an exemplary second bias transistor that forms a pair with the NMOS transistor HVMN1. The NMOS transistor HVMN2 has a main-terminal interconnecting portion (between the drain and the source) on the power-supply potential side of the NMOS transistor MN2 in the second current path, and receives, at the control terminal (gate), a bias voltage from the bias-voltage generating circuit 110. Similar to the NMOS transistor HVMN1, the NMOS transistor HVMN2 restricts the voltage at the second main terminal to a voltage obtained by subtracting the gate-source voltage of the NMOS transistor HVMN2 from the bias voltage.

The PMOS transistor HVMP1 is an exemplary first power-supply side transistor. The PMOS transistor HVMP1 has: a main-terminal interconnecting portion (source-drain) on the power-supply potential side of the NMOS transistor HVMN1 in the first current path; and has a control terminal (gate) connected on the power-supply potential side of the NMOS transistor HVMN1. The PMOS transistor HVMP2 is an exemplary second power-supply side transistor that forms a pair with the PMOS transistor HVMP1. The PMOS transistor HVMP2 has: a main-terminal interconnecting portion on the power-supply potential side of the NMOS transistor HVMN2 in the second current path; and a control terminal connected to the control terminal of the PMOS transistor HVMP1. That is, a current mirror connection is established between the PMOS transistor HVMP1 and the PMOS transistor HVMP2.

The PMOS transistor MP1 has: a main-terminal interconnecting portion (source-drain) on the power-supply potential side of the PMOS transistor HVMP1 in the first current path; and has a control terminal (gate) connected on the power-supply potential side of the PMOS transistor HVMP1. The PMOS transistor MP2 has: a main-terminal interconnecting portion (source-drain) on the power-supply potential side of the PMOS transistor HVMP2 in the second current path; and has a control terminal (gate) connected to the control terminal of the PMOS transistor MP1. That is, a current mirror connection is established between the PMOS transistor MP1 and the PMOS transistor MP2. The pair of the PMOS transistor HVMP1 and PMOS transistor MP1, and the pair of the PMOS transistor HVMP2 and PMOS transistor MP2 change a voltage V2a between the PMOS transistor HVMP1 and the NMOS transistor HVMN1, and a voltage V1a between the PMOS transistor HVMP2 and the NMOS transistor HVMN2 according to the difference between a current I2a flowing through the PMOS transistor HVMP1 and PMOS transistor MP1, and a current I1a flowing through the PMOS transistor HVMP2 and PMOS transistor MP2.

With the configuration illustrated above, the differential amplifier 120 makes the current I2b larger than the current I1b if the reference voltage Vref is higher than the comparison target voltage. Since the total of the current I2b and current I1b is restricted by the tail current I0, and so the current I1b decreases, a voltage drop due to the PMOS transistor MP2 and PMOS transistor HVMP2 decreases. As a result, the output voltage V1a of the differential amplifier 120 (a voltage between the PMOS transistor HVMP2 and the NMOS transistor HVMN2) increases. Conversely, the differential amplifier 120 makes the current I2b smaller than the current I0b if the reference voltage Vref is lower than the comparison target voltage. Since the total of the current I2b and current I1b is restricted by the tail current I0, and so the current I1b increases, a voltage drop due to the PMOS transistor MP2 and PMOS transistor HVMP2 increases. As a result, the output voltage V1a of the differential amplifier 120 (a voltage between the PMOS transistor HVMP2 and the NMOS transistor HVMN2) decreases.

In the example illustrated above, the NMOS transistor MN1 and NMOS transistor MN2, the NMOS transistor HVMN1 and NMOS transistor HVMN2, the PMOS transistor HVMP1 and PMOS transistor HVMP2, and the PMOS transistor MP1 and PMOS transistor MP2, respectively forming pairs, desirably share the same characteristics. In view of this, each pair of transistors mentioned above may be designed and produced to have identical design parameters (channel length, channel width, gate length, etc.).

The output circuit 130 is connected between the power-supply potential VCC and the reference potential VSS. The output circuit 130 has the NMOS transistor HVMN3, an NMOS transistor HVMN4, a voltage conversion circuit 140, the first voltage-clamp circuit 150, a load 145, a resistor R4, a PMOS transistor HVMP3, a PMOS transistor MP3, and a PMOS transistor MP4.

The NMOS transistor HVMN3 is an exemplary first output-stage transistor. The NMOS transistor HVMN3 has: a first main terminal (drain) connected on the power-supply potential side; a second main terminal (source) connected on the reference-potential side; and a control terminal (gate) connected to the second current path. That is, the NMOS transistor HVMN3 constitutes a source follower circuit. In the present embodiment, the control terminal of the NMOS transistor HVMN3 is connected to the second current path on the power-supply potential side of the NMOS transistor HVMN2, more specifically, between the NMOS transistor HVMN2 and the PMOS transistor HVMP2. The NMOS transistor HVMN3 has a resistance at the main-terminal interconnecting portion that is controlled according to the output voltage V1a of the differential amplifier 120, and outputs, through the second main terminal, an output voltage that changes according to the output voltage V1a.

The NMOS transistor HVMN4 is an exemplary second output-stage transistor. The NMOS transistor HVMN4 has: a first main terminal (drain) connected on the power-supply potential side; a second main terminal (source) connected on the reference-potential side; and a control terminal (gate) connected to the second current path. That is, the NMOS transistor HVMN4 constitutes a source follower circuit. The NMOS transistor HVMN4 also has a resistance at the main-terminal interconnecting portion that is controlled according to the output voltage V1a of the differential amplifier 120, and outputs, through the second main terminal, an output voltage that changes according to the output voltage V1a. The NMOS transistor HVMN4 may output the voltage at the second main terminal as the output voltage Vout to an external instrument or the like to which the apparatus 100 is connected. In the present embodiment, the NMOS transistor HVMN3 and NMOS transistor HVMN4 may be designed and produced to have the same potential difference between each pair of their control terminals and second main terminals (the gate-source voltage in this figure) when they are turned on. Thereby, an output voltage output from the second main terminal of the NMOS transistor HVMN3 becomes substantially identical to the output voltage Vout output from the second main terminal of the NMOS transistor HVMN4, although there can be a certain degree of error therebetween. In the present specification, it is assumed that the NMOS transistor HVMN3 and NMOS transistor HVMN4 output the identical output voltages Vout for convenience of explanation.

Note that the apparatus 100 may not include the NMOS transistor HVMN4, but may be configured to supply the voltage at the second main terminal of the NMOS transistor HVMN3 to at least one of the load 145, an external instrument, or the like. In addition, the apparatus 100 may include a plurality of NMOS transistors HVMN4, and may be configured to supply the output voltage Vout to each of a plurality of loads 145, a plurality of instruments, or the like.

The voltage conversion circuit 140 generates a voltage corresponding to the voltage Vout on the second-main-terminal side of the NMOS transistor HVMN3, and inputs the voltage to the control terminal of the NMOS transistor MN2 in the differential amplifier 120 as the comparison target voltage. The voltage conversion circuit 140 according to the present embodiment is a resistive voltage divider for example, and resistively divides the output voltage Vout at a resistor R2 and a resistor R3. Thereby, the NMOS transistor MN2 can receive, at the control terminal, a voltage obtained by dividing the voltage on the reference-potential side of the NMOS transistor HVMN3.

As mentioned above, if the reference voltage Vref becomes higher than the comparison target voltage, the output voltage V1a of the differential amplifier 120 rises. Along with this, the resistance between the drain and source of the NMOS transistor HVMN3 decreases, and the output voltage Vout rises. Conversely, if the reference voltage Vref becomes lower than the comparison target voltage, the output voltage V1a of the differential amplifier 120 falls. Along with this, the resistance between the drain and source of the NMOS transistor HVMN3 increases, and the output voltage Vout falls. In this manner, the apparatus 100 performs feedback operation such that the comparison target voltage becomes equal to the reference voltage Vref. Here, if the voltage conversion circuit 140 resistively divides the output voltage Vout such that it becomes 1/N, the apparatus 100 performs operation such that "comparison target voltage 1/N·Vout" becomes equal to the reference voltage Vref. As a result, the apparatus 100 performs operation such that the output voltage Vout becomes equal to N·Vref. Note that the apparatus 100 may not have the voltage conversion circuit 140, but may supply the output voltage Vout directly to the control terminal of the NMOS transistor MN2. In this case, the apparatus 100 performs operation such that the output voltage Vout becomes equal to the reference voltage Vref.

The first voltage-clamp circuit 150 is connected between the control terminal and second main terminal of the NMOS transistor HVMN3, and restricts the potential difference between the voltage at the control terminal of the NMOS transistor HVMN3 and the voltage at the second main terminal of the NMOS transistor HVMN3 such that it becomes equal to or smaller than a predetermined potential difference. The first voltage-clamp circuit 150 may have at least one Zener diode ZD1 having an anode that is connected on the second-main-terminal side of the NMOS transistor HVMN3, and a cathode that is connected on the control terminal side of the NMOS transistor HVMN3. As necessary, the first voltage-clamp circuit 150 may be configured to include a plurality of Zener diodes that are provided in parallel if it is necessary to cause a large current to flow at the time of breakdown, and may be configured to include a plurality of Zener diodes that are provided in series if a voltage to be restricted is made high. The first voltage-clamp circuit 150 may be another known circuit instead of a circuit using Zener diodes, and restrict the voltage of the control terminal using the voltage at the second main terminal of the NMOS transistor HVMN3 as a reference voltage. Since the gate-source voltage applied between the gate and source of the NMOS transistor HVMN3 can be restricted by providing the first voltage-clamp circuit 150, it becomes possible to prevent breakdown of the control terminal of the NMOS transistor HVMN3. Stated differently, it becomes unnecessary to increase the gate withstand voltage of the NMOS transistor HVMN3.

The load 145 is a circuit that performs operation by receiving the output voltage Vout of the NMOS transistor HVMN4. The load 145 is provided in an apparatus such as an integrated circuit including the apparatus 100, receives the output voltage Vout from the NMOS transistor HVMN4, and performs operation in accordance with the specifications of the apparatus.

The resistor R4, the main-terminal interconnecting portion of the PMOS transistor HVMP3, and the main-terminal interconnecting portion of the PMOS transistor MP3 form a constant-current circuit connected in series in this order between the PMOS transistor HVMP3 and the power-supply potential VCC. The resistor R4 generates a voltage drop having a magnitude corresponding to a current flowing therethrough. The PMOS transistor HVMP3 has a control terminal that is connected between the resistor R4, and NMOS transistors HVMN3 to 4, and receives, at the control terminal, a voltage that has fallen from the voltage at the main terminal on the NMOS transistor HVMN3 side due to the resistor R4. The PMOS transistor MP3 has a control terminal that is connected between the PMOS transistor HVMP3 and the resistor R4, and receives, at the control terminal, a voltage that has fallen from the voltage at the main terminal on the PMOS transistor HVMP3 side due to the PMOS transistor HVMP3. Thereby, the PMOS transistor HVMP3 and PMOS transistor MP3 receive a voltage equal to or higher than a threshold voltage between each pair of their sources and gates, and are turned on. Thus, the resistor R4, the main-terminal interconnecting portion of the PMOS transistor HVMP3, and the main-terminal interconnecting portion of the PMOS transistor MP3 cause a constant current that is preset by the resistance of the resistor R4 to flow. Accordingly, the NMOS transistor HVMN3 at a latter stage causes a current that is determined by the resistors R2 and R3 inside the voltage conversion circuit 140, and the reference voltage Vref to flow through the main-terminal interconnecting portion.

The PMOS transistor MP4 has: a main-terminal interconnecting portion that is connected between the power-supply potential VCC and the reference potential VSS; and a control terminal connected to the control terminal of the PMOS transistor MP3. A current mirror connection is established between the PMOS transistor MP4 and the PMOS transistor MP3, and the PMOS transistor MP4, along with the PMOS transistor MP3, constitutes a current mirror circuit connected between the power-supply potential VCC and the PMOS transistor HVMP3. With such a configuration, the PMOS transistor MP4 can generate a constant current that is obtained by multiplying a constant current flowing though the PMOS transistor MP3 by a constant, and provide the constant current to an integrated circuit or the like provided with the apparatus 100 or an external circuit.

Note that if a constant current is not necessary, the apparatus 100 may be configured to not include a constant-current circuit and a current mirror circuit that include the resistor R4, PMOS transistor HVMP3, PMOS transistor MP3, and PMOS transistor MP4.

In addition to the configuration mentioned above, the apparatus 100 may include a resistor R1 and a capacitor C1 that are connected in series between the control terminal of the NMOS transistor HVMN3 and the reference potential VSS. The resistor R1 and capacitor C1 perform phase compensation for a feedback control loop, and prevent oscillation of the output voltage Vout.

In addition, the apparatus 100 may further include a second voltage-clamp circuit 160 connected between the first current path in the differential amplifier 120 and the reference potential VSS. The second voltage-clamp circuit 160 may include at least one Zener diode ZD2 that has an anode connected to the reference potential VSS, and is connected to the first current path.

The differential amplifier 120 ideally changes a current that flows through the first current path and a current that flows through the second current path complementarily without causing the currents that flow through the first current path and second current path to flow out of the differential amplifier 120, and make the magnitudes of the currents the same when the first differential input and the second differential input are equal to each other. Here, since the NMOS transistor HVMN3 having relatively low gate withstand voltage us used, the first voltage-clamp circuit 150 is provided between the control terminal and second main terminal of the NMOS transistor HVMN3. If a leakage current occurs in the first voltage-clamp circuit 150, a current Ileak1 inevitably leaks from the second current path due to the first voltage-clamp circuit 150, and balance is lost between the current that flows through the first differential-input transistor and the current that flows through the second differential-input transistor, and an error is generated in the output voltage Vout. In view of this, the apparatus 100 may further include the second voltage-clamp circuit 160 which makes a current Ileak2 leak from the first current path. Since, by using the first voltage-clamp circuit 150 and second voltage-clamp circuit 160 having substantially identical characteristics, the current Ileak2 becomes substantially identical to the current Ileak1, the apparatus 100 can make the current I2b that flows through the first differential-input transistor and the current I1b that flows through the second differential-input transistor balanced.

In the present embodiment, the second voltage-clamp circuit 160 is connected to the first current path between the NMOS transistor HVMN1 and the NMOS transistor MN1. Thereby, as compared with the case where the second voltage-clamp circuit 160 is connected on the power-supply potential side of the NMOS transistor HVMN1 similar to the first voltage-clamp circuit 150, it becomes possible to prevent changes of the voltage V2a from being inhibited due to breakdown of the second voltage-clamp circuit 160.

In the example mentioned above, transistors having relatively low gate withstand voltage and drain-source withstand voltage can be used as the PMOS transistors MP1 to 3 and NMOS transistors MN1 to 5. In addition, transistors having relatively low gate withstand voltage can be used as the PMOS transistors HVMP1 to 3 and NMOS transistor HVMN1 to 2, although they are required to have high drain-source withstand voltage. Then, although the NMOS transistor HVMN3 is required to have high drain-source withstand voltage, a transistor having relatively low gate withstand voltage can be used as the NMOS transistor HVMN3 by providing the first voltage-clamp circuit 150 between its control terminal and second main terminal. Although the NMOS transistor HVMN4 is required to have high drain-source withstand voltage, since it receives, at its control terminal, the same voltage as that of the NMOS transistor HVMN3, and outputs, from the second main terminal, the same output voltage as that of the NMOS transistor HVMN3, a transistor having relatively low gate withstand voltage can be used as the NMOS transistor HVMN4, similar to the NMOS transistor HVMN3. Note that, in this figure, transistors having high drain-source withstand voltage are indicated by symbols including "HV (High Voltage)".

In this manner, the apparatus 100 can be configured not to include transistors having high gate withstand voltage. Here, although high drain-source withstand voltage can be realized by increasing the distance between a drain and a source, attaining high gate withstand voltage might require addition or changes in production processes in order to increase the film thicknesses of gate insulators. Thus, the apparatus 100 configured not to include transistors having high gate withstand voltage can be produced at reduced costs.

Figure 2:
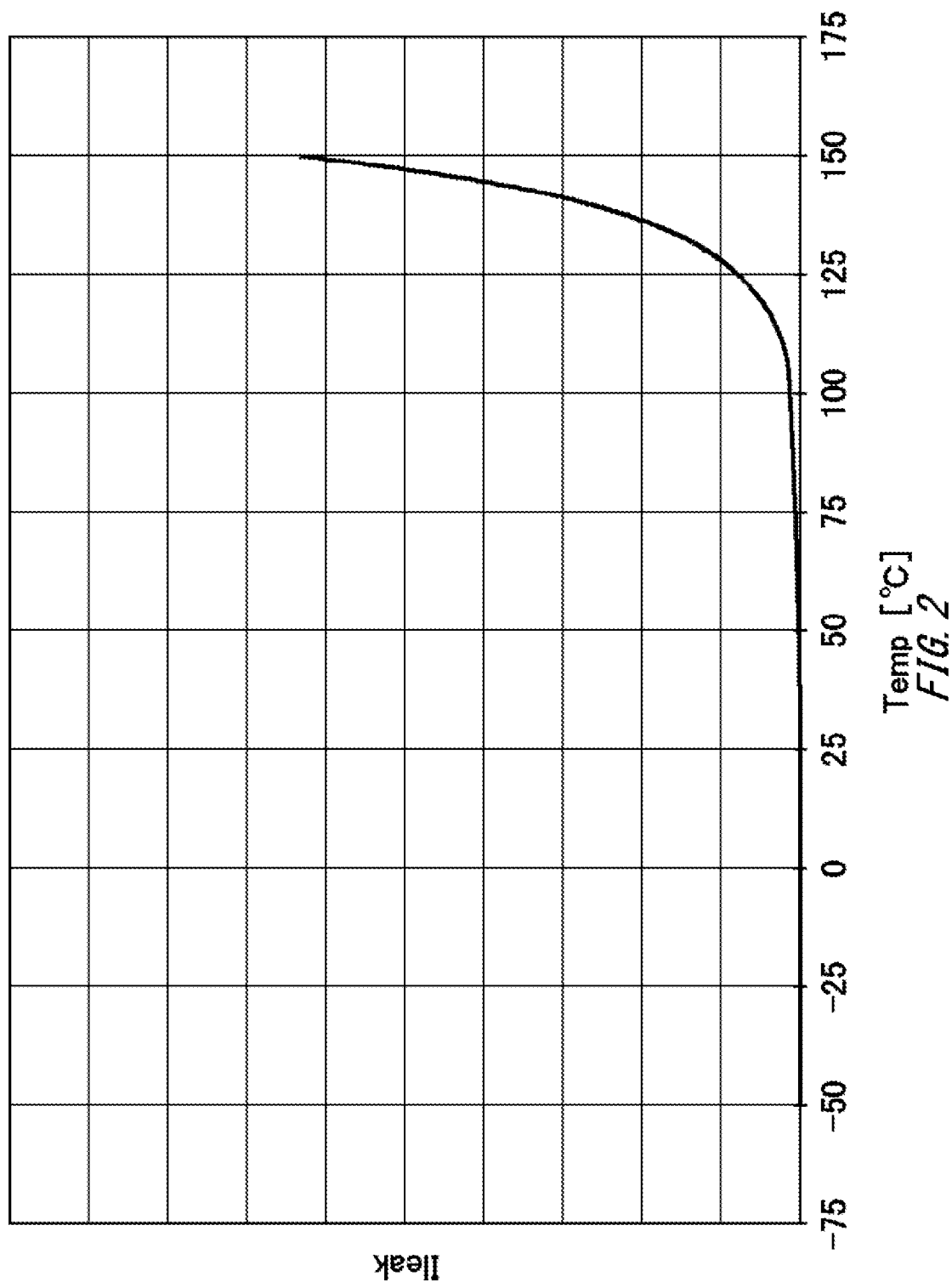
FIG. 2 illustrates exemplary leakage characteristics of a first voltage-clamp circuit according to an embodiment of the present invention.

FIG. 2 illustrates exemplary leakage characteristics of a first voltage-clamp circuit according to the present embodiment. In this figure, the horizontal axis corresponds to temperature, and the vertical axis corresponds to leakage current. In the example illustrated in this figure, the Zener diode ZD1 used as the first voltage-clamp circuit 150 generates leakage current that increases as the temperature rises.

Figure 3:
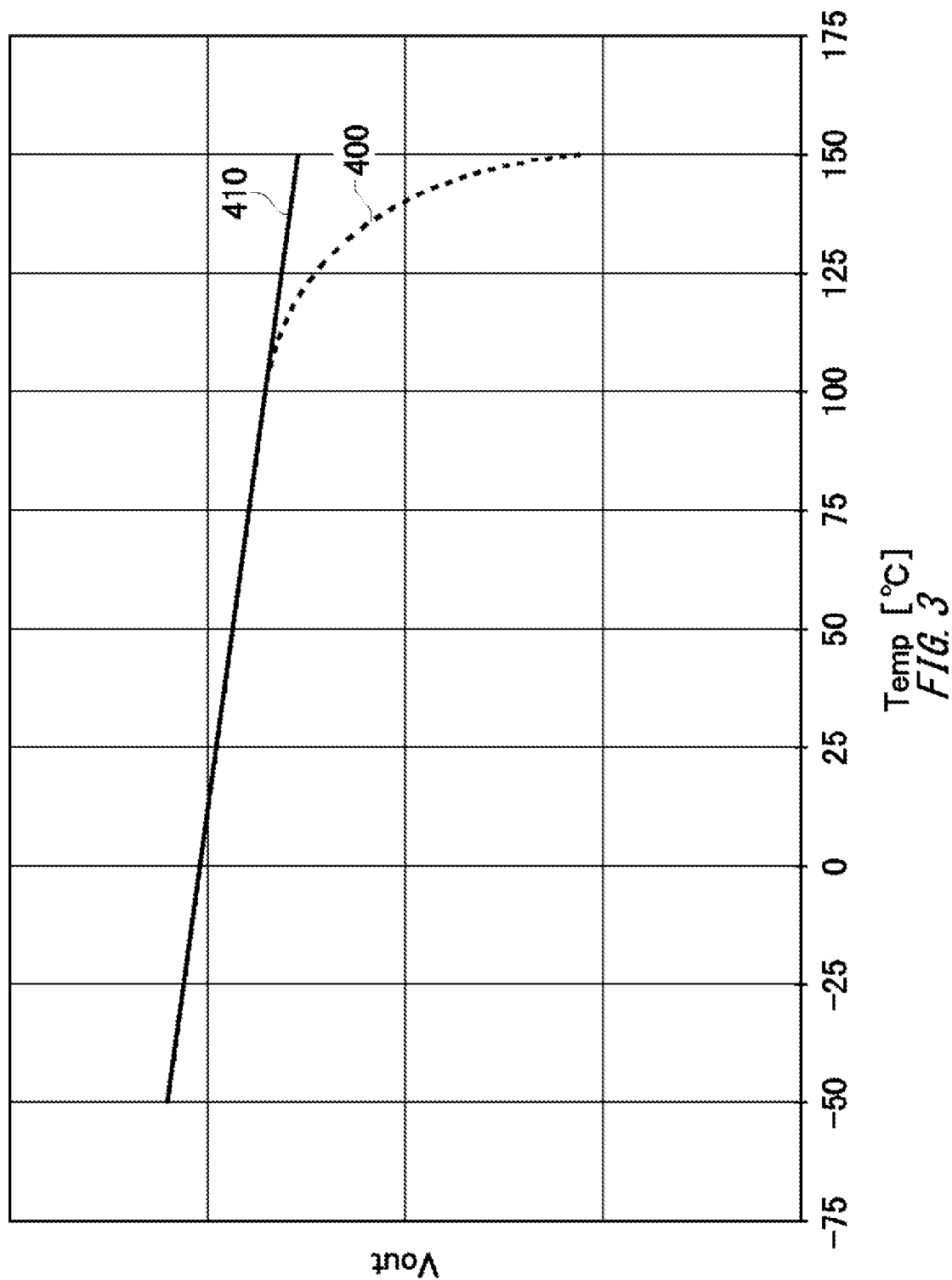
FIG. 3 illustrates exemplary output-voltage characteristics of the apparatus 100 according to an embodiment of the present invention.

FIG. 3 illustrates exemplary output-voltage characteristics of the apparatus 100 according to the present embodiment. In this figure, the horizontal axis corresponds to temperature, and the vertical axis corresponds to the output voltage Vout of the apparatus 100. The output-voltage characteristics curve 400 indicates output-voltage characteristics of the apparatus 100 when the first voltage-clamp circuit 150 is provided, but the second voltage-clamp circuit 160 is not provided. The output-voltage characteristics curve 410 indicates the output-voltage characteristics of the apparatus 100 when the first voltage-clamp circuit 150 and second voltage-clamp circuit 160 are provided.

If the apparatus 100 is not provided with the second voltage-clamp circuit 160, the current I2b that flows through the NMOS transistor MN1 in the first current path becomes equal to I2a, and the current I1b that flows through the NMOS transistor MN2 in the second current path becomes equal to I1a−Ileak1. Accordingly, when the state of the differential amplifier 120 is balanced (I2a=I1a), the current I1b that flows through the second differential-input transistor MN2 becomes equal to I2b−Ileak1, and the voltage at the control terminal of the second differential-input transistor MN2 is stabilized at a voltage lower than the reference voltage Vref received at the control terminal of the first differential-input transistor MN1. As a result, in the apparatus 100, as the temperature rises and the current Ileak1 increases, the control voltage of the NMOS transistor HVMN3 lowers, and the output voltage Vout inevitably falls as indicated by the output-voltage characteristics curve 400.

In contrast, if the apparatus 100 is provided with the second voltage-clamp circuit 160, the current I2b that flows through the NMOS transistor MN1 in the first current path becomes equal to I1a−Ileak2, and the current I1b that flows through the NMOS transistor MN2 in the second current path becomes equal to I1a−Ileak1. Accordingly, by configuring the first voltage-clamp circuit 150 and second voltage-clamp circuit 160 identically such that Ileak2≈Ileak1, if the first differential input and second differential input have the same voltage (I1b=I2b), the currents I1a and I1a that flow through the PMOS transistor MP2 and PMOS transistor HVMP2 become approximately equal. As a result, the apparatus 100 can suppress lowering of the output voltage Vout accompanying an increase of the leakage current Ileak1 of the first voltage-clamp circuit 150 as illustrated in the output-voltage characteristics curve 410.

Figure 4:
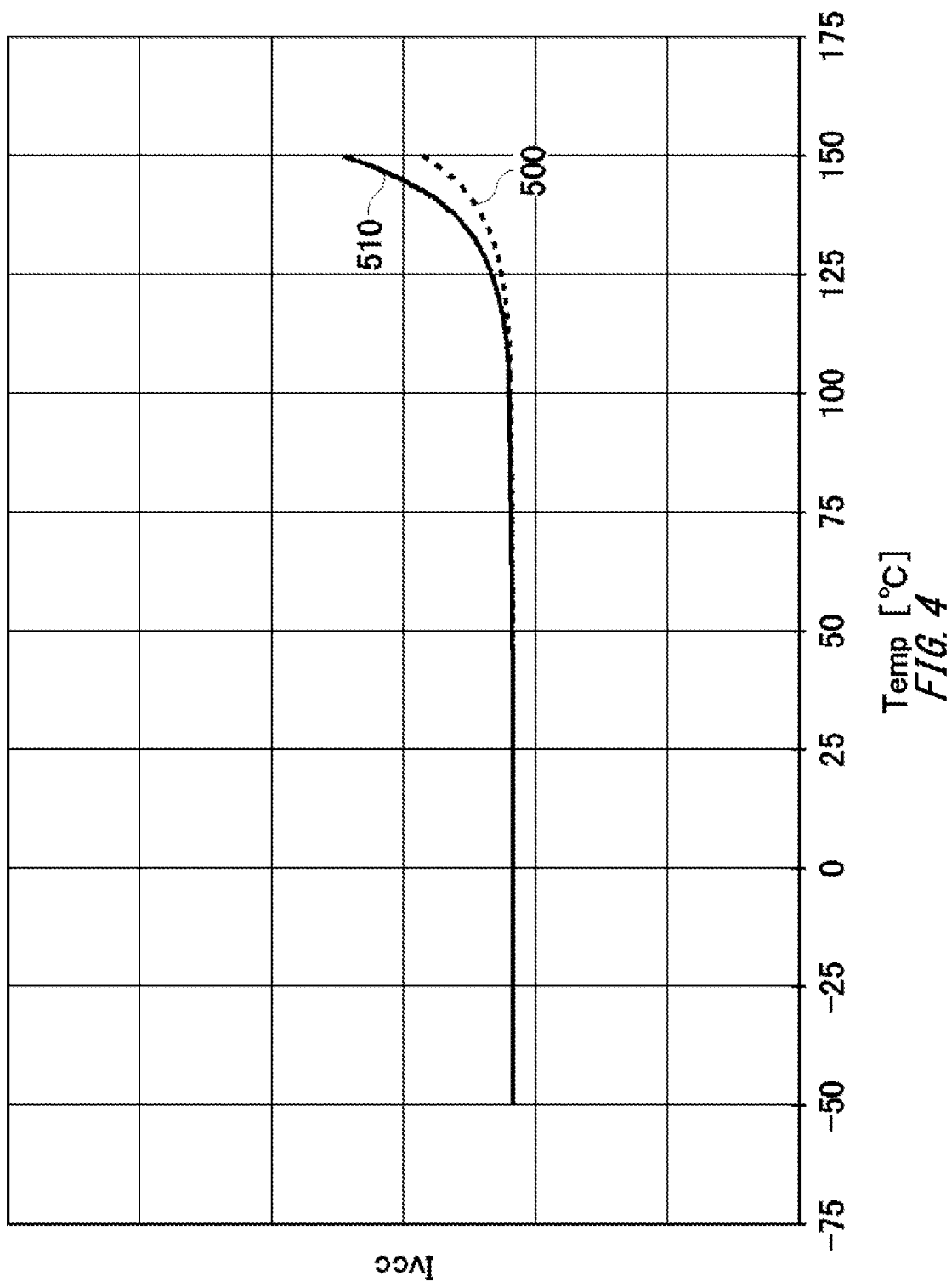
FIG. 4 illustrates exemplary consumed-current characteristics of the apparatus 100 according to an embodiment of the present invention.

FIG. 4 illustrates exemplary consumed-current characteristics of the apparatus 100 according to the present embodiment. In this figure, the horizontal axis corresponds to temperature, and the vertical axis corresponds to consumed current Ivcc of the apparatus 100. The consumed-current characteristics curve 500 indicates consumed-current characteristics of the apparatus 100 when the first voltage-clamp circuit 150 is provided, but the second voltage-clamp circuit 160 is not provided. The consumed-current characteristics curve 510 indicates consumed-current characteristics of the apparatus 100 when the first voltage-clamp circuit 150 and second voltage-clamp circuit 160 are provided.

If the apparatus 100 is not provided with the second voltage-clamp circuit 160, the consumed current of the apparatus 100 increases as indicated by the consumed-current characteristics curve 500 along with a temperature increase, due to the influence of leakage current in first voltage-clamp circuit 150. If the apparatus 100 is provided with the second voltage-clamp circuit 160, the consumed current is not different from that in the configuration provided with the second voltage-clamp circuit 160 until the temperature reaches about 100 degrees. At the temperature of 100 degrees or higher, the consumed current increases by an amount corresponding to addition of the second voltage-clamp circuit 160 having the leakage characteristics illustrated in FIG. 2, as indicated by the consumed-current characteristics curve 510. Although the consumed current increases as illustrated, if the apparatus 100 might be operated in an environment where an error that cannot be neglected is generated in the output voltage Vout due to the leakage current Ileak1 of the first voltage-clamp circuit 150 or in other cases, the apparatus 100 may be configured to include the second voltage-clamp circuit 160.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

In the embodiment mentioned above, the apparatus 100 is illustrated as a voltage regulator that receives the reference voltage Vref which is a constant voltage, and outputs the output voltage Vout which is a constant voltage. Instead, the apparatus 100 may be an output buffer apparatus that receives an input signal the voltage value of which is variable as the first differential input, and outputs the output voltage Vout the voltage of which changes corresponding to the input signal. In addition, the apparatus 100 may be a differential buffer apparatus that receives, instead of a voltage corresponding to the output voltage Vout as the second differential input, a differential signal as the first differential input and second differential input, and outputs an output voltage corresponding to the differential signal.

In addition, in the embodiment mentioned above, the apparatus 100 illustrated uses P channel type MOS transistors as the PMOS transistors MP1 to 3 and PMOS transistors HVMP1 to 3, and N channel type MOS transistors as the NMOS transistors HVMN1 to 4 and NMOS transistors MN1 to 5. Instead, in the apparatus 100, at least one P channel type MOS transistor may be replaced with an N channel type MOS transistor, and/or at least one N channel type MOS transistor may be replaced with a P channel type MOS transistor, and surrounding circuits in the apparatus 100 may be configured differently as appropriate according to such changes.

In addition, in the embodiment mentioned above, the apparatus 100 illustrated uses MOS transistors each having a control terminal that is called a gate, and two main terminals that are called a drain and a source, as the PMOS transistors MP1 to 3, PMOS transistors HVMP1 to 3, NMOS transistors HVMN1 to 4, and NMOS transistors MN1 to 5. Instead, the apparatus 100 may use a bipolar transistor or the like having a control electrode that is called a base, and two main electrodes that are called a collector and an emitter, as at least one of the transistors mentioned above. In addition, the apparatus 100 may use IGBTs (insulated gate bipolar transistors) each having a control terminal that is called a gate, and two main terminals that are called a collector and an emitter, as the NMOS transistor HVMN3 and NMOS transistor HVMN4, if it is to output large current. Part of circuits in the apparatus 100 may be configured differently as appropriate according to such changes.

What is claimed is:

1. An apparatus comprising:
    a differential amplifier having a first current path and a second current path that form a differential pair;
    a first output-stage transistor that has: a first main terminal connected on a power supply potential side;
    a second main terminal connected on a reference-potential side; and a control terminal connected to the second current path;
    a first voltage-clamp circuit connected between the control terminal and the second main terminal of the first output-stage transistor, without any intervening transistor and
    a second voltage-clamp circuit connected between the first current path of the differential amplifier and a reference potential, wherein the differential amplifier has:
    a first differential-input transistor including: a first main terminal provided on the power-supply potential side in the first current path; a second main terminal provided on the reference-potential side in the first current path: and a control terminal that receives first differential input;
    a second differential-input transistor including: a first main terminal provided on the power-supply potential side in the second current path; a second main terminal provided on the reference-potential side in the second current path; and a control terminal that receives second differential input;
    a first bias transistor that includes: a main-terminal interconnecting portion provided on the power-supply potential side of the first differential-input transistor in the first current path; and a control terminal that receives a bias voltage; and
    a second bias transistor that includes a main-terminal interconnecting portion provided on the power-supply potential side of the second differential-input transistor in the second current path; and a control terminal that receives the bias voltage, wherein
    the first bias transistor including: a first main terminal provided on the power-supply potential side in the first current path; a second main terminal provided on the reference-potential side in the first current path,
    the second bias transistor including: a first main terminal provided on the power-supply potential side in the second current path;
    a second main terminal provided on the reference-potential side in the second current path, the second main terminal of the first bias transistor connected to the first main terminal of the first differential-input transistor is a first connection point,
    the second main terminal of the second bias transistor connected to the first main terminal of the second differential-input transistor is a second connection point,
    the control terminal of the first output-stage transistor and the first voltage clamp circuit are connected to the first main terminal of the second bias transistor,
    the first voltage-clamp circuit is not connected to the second connection point of the second current path, and
    the second voltage-clamp circuit is connected to the first connection point of the first current path;

wherein
a current leakage occurring in the first voltage-clamp circuit causes a first leakage from the second current path, and a current leakage occurring in the second voltage-clamp circuit causes a second leakage from the first current path, such that the first leakage and the second leakage are substantially identical.

2. The apparatus according to claim 1, wherein the differential amplifier has:
a first power-supply side transistor that includes: a main-terminal interconnecting portion on the power-supply potential side of the first bias transistor in the first current path; and a control terminal connected on the power-supply potential side of the first bias transistor; and
a second power-supply side transistor that includes: a main-terminal interconnecting portion provided on the power-supply potential side of the second bias transistor in the second current path; and a control terminal connected to the control terminal of the first power-supply side transistor, and
the control terminal of the first output-stage transistor is connected between the second bias transistor and the second power-supply side transistor in the second current path.

3. The apparatus according to claim 1, wherein the second differential-input transistor receives, at the control terminal, a voltage corresponding to a voltage on a second-main-terminal side of the first output-stage transistor.

4. The apparatus according to claim 3, wherein the second differential input transistor receives, at the control terminal, a voltage obtained by dividing a voltage on the reference-potential side of the first output-stage transistor.

5. The apparatus according to claim 1, further comprising a second output-stage transistor having: a first main terminal connected on a power-supply potential side; a second main terminal connected on a reference-potential side; and a control terminal connected to the control terminal of the first output-stage transistor.

6. The apparatus according to claim 1, further comprising a current mirror circuit connected between the power-supply potential and the first output-stage transistor.

7. The apparatus according to claim 1, wherein the first voltage-clamp circuit and the second voltage-clamp circuit has at least one Zener diode.

8. The apparatus according to claim 1, further comprising a predetermined transistor having a third current path between a first main terminal provided on the power-supply potential side and a second main terminal provided on the reference-potential side thereof, wherein
a total current of a first current flowing in the first current path and a second current flowing in the second current path flows in the third current path.

9. The apparatus according to claim 1, further comprising a current mirror circuit connected between the power-supply potential and the first output-stage transistor, the current mirror circuit including a first transistor having a second main terminal which is provided on the reference-potential side and connected to the first main terminal of the first output-stage transistor and a control terminal connected to the first main terminal of the first output-stage transistor, and a second transistor having a control terminal connected to the first main terminal of the first output-stage transistor and a second main terminal provided on the reference-potential side and connected to a load terminal.

10. The apparatus according to claim 1, wherein the first voltage-clamp circuit includes a Zener diode, and the second voltage-clamp circuit is arranged between the first connection point and the reference-potential side and includes a Zener diode.

11. The apparatus according to claim 1, wherein a third connection point is that the control terminal of the first output-stage transistor and the first voltage clamp circuit are connected to the first main terminal of the second bias transistor, and a first number of transistors between the third connection point and the reference potential in the second current path is larger than a second number of transistors between the first connection point and the reference potential in the first current path.

12. An apparatus comprising:
a differential amplifier having a first current path and a second current path that form a differential pair;
a first output-stage transistor that has: a first main terminal connected on a power-supply potential side; a second main terminal connected on a reference-potential side; and a control terminal connected to the second current path;
a first voltage-clamp circuit connected between the control terminal and the second main terminal of the first output-stage transistor, without any intervening transistor; and
a second voltage-clamp circuit connected between the first current path of the differential amplifier and a reference potential, wherein
the differential amplifier has:
a first differential-input transistor including: a first main terminal provided on the power-supply potential side in the first current path; a second main terminal provided on the reference-potential side in the first current path; and a control terminal that receives first differential input;
a second differential-input transistor including: a first main terminal provided on the power-supply potential side in the second current path; a second main terminal provided on the reference-potential side in the second current path; and a control terminal that receives second differential input;
a first bias transistor that includes: a main-terminal interconnecting portion provided on the power-supply potential side of the first differential-input transistor in the first current path; and a control terminal that receives a bias voltage; and
a second bias transistor that includes a main-terminal interconnecting portion provided on the power-supply potential side of the second differential-input transistor in the second current path; and a control terminal that receives the bias voltage, wherein
the first bias transistor including: a first main terminal provided on the power-supply potential side in the first current path; a second main terminal provided on the reference-potential side in the first current path,
the second bias transistor including: a first main terminal provided on the power-supply potential side in the second current path; a second main terminal provided on the reference-potential side in the second current path,
the second main terminal of the first bias transistor connected to the first main terminal of the first differential-input transistor is a first connection point, the second main terminal of the second bias transistor connected to the first main terminal of the second differential-input transistor is a second connection point, a third connection point that is at the control terminal of the first output-stage transistor and the first voltage-clamp circuit are connected to the first main terminal of the second bias transistor, the first voltage-clamp circuit is not connected to the second connection point of the second current path, and the second voltage-clamp circuit is connected to the first connection point of the first current path, a first number of transistors between the third connection point and the reference potential in the second current path is larger than a second number of transistors between the first connection point and the reference potential in the first current path.

13. The apparatus according to claim 12, further comprising
a predetermined transistor having a third current path between a first main terminal provided on the power-supply potential side and a second main terminal provided on the reference-potential side thereof, wherein
a total current of a first current flowing in the first current path and a second current flowing in the second current path flows in the third current path.

14. The apparatus according to claim 12, further comprising
a current mirror circuit connected between the power-supply potential and the first output-stage transistor, the current mirror circuit including a first transistor having a second main terminal which is provided on the reference-potential side and connected to the first main terminal of the first output-stage transistor and a control terminal connected to the first main terminal of the first output-stage transistor, and a second transistor having a control terminal connected to the first main terminal of the first output-stage transistor and a second main terminal provided on the reference-potential side and connected to a load terminal.

15. The apparatus according to claim 12, wherein
the first voltage-clamp circuit includes a Zener diode, and
the second voltage-clamp circuit is arranged between the first connection point and the reference-potential side and includes a Zener diode.

16. The apparatus according to claim 12, wherein the first voltage-clamp circuit is directly connected between the control terminal and the second main terminal of the first output-stage transistor.

17. The apparatus according to claim 12, further includes a predetermined transistor including: a first main terminal provided on the power-supply potential side in both of the first current path and the second current path; a second main terminal provided on the reference-potential side in both of the first current path and the second current path,
wherein both of the second main terminal of the first differential-input transistor and the second main terminal of the second differential-input transistor is connected to the first main terminal of the predetermined transistor.

* * * * *